United States Patent [19]
Chen et al.

[11] Patent Number: 5,300,791
[45] Date of Patent: Apr. 5, 1994

[54] LIGHT EMITTING DIODE

[75] Inventors: Tzer-Perng Chen; Chin-Yuan Chen; Jyi-Ren Deng; Ming-Jiunn Jou; Biing-Jye Lee; Jenn-Yu Kao, all of Hsinchu, Taiwan

[73] Assignee: Industrial Technology Research Institute, Hsinchu, Taiwan

[21] Appl. No.: 953,659

[22] Filed: Sep. 29, 1992

[51] Int. Cl.⁵ .............................. H01L 33/00
[52] U.S. Cl. ........................ 257/94; 257/96; 257/103; 257/656
[58] Field of Search .............. 257/94, 96, 103, 656

[56] References Cited

U.S. PATENT DOCUMENTS

| | | | |
|---|---|---|---|
| 4,868,615 | 9/1989 | Kamata | 257/103 |
| 5,140,385 | 8/1992 | Kukimoto et al. | 257/103 |

*Primary Examiner*—Edward Wojciechowicz
*Attorney, Agent, or Firm*—Marshall & Melhorn

[57] ABSTRACT

A light emitting diode is provided with a window layer of ZnSSe semiconductor material having a second conductivity type. The second conductivity type ZnSSe window layer has a low electrical resistivity so that it can be used as a current spreading layer, and a bandgap higher than that of the active layer so that it is transparent to light emitted from the active layers. The second conductivity type ZnSSe window layer can be doped with a donor concentration of more than $10^{18}$ cm$^{-3}$. Furthermore, its lattice constant is close to that of the active layers and confining layers so that deterioration in optical characteristic due to lattice mismatch is minimized.

6 Claims, 4 Drawing Sheets

LIGHT EMITTING DIODE

BACKGROUND OF THE INVENTION

1. Field of the Invention

The present invention relates in general to light emitting diodes, and more specifically, to light emitting diodes using a material of ZnSSe as a transparent layer.

2. Description of Prior Art

There are three prior art LEDs of AlGaInP system in relevance to the present invention. In FIG. 1 there is shown a conventional LED, which is disclosed in Prog. Crystal Growth and Charact', Vol. 19, pp. 97-105 by J.P. Andre et al. The LED of FIG. 1 is fabricated with a back electrode 110, a substrate of n-type GaAs 120, a double heterostructure of AlGaInP 130, which includes a layer of n-type AlGaInP 131, a layer of undoped AlGaInP 132, and a layer of p-type AlGaInP 133, and a second electrode 140. The undoped AlGaInP layer 132 is technically referred to as an active layer, and the two neighboring n-type AlGaInP layer 131 and p-type AlGaInP layer 132 are referred to as confining layers.

For efficient operation of the LED, current injected by the front electrode 140 should be spread evenly to the lateral direction so that current will cross the p-n junction of the double heterostructure of AlGaInP 130 uniformly to thereby generate light uniformly across the same. Since the p-type AlGaInP layer 133 is grown by means of the metal-organic vapor phase epitaxy (MOVPE) process, it is very difficult to dope with acceptors with a concentration of higher than $1 \times 10^{18}$ cm$^{-3}$. Moreover, it is a material characteristic that hole mobility is low in p-type AlGaInP semiconductor. Due to these two factors, the electrical resistivity of the p-type AlGaInP layer 132 is comparatively high so that lateral current flow from the front electrode 140 is severely restricted. As a result, current injected by the front electrode 140 tends to flow only through the center portions of the double heterostructure of AlGaInP 130 and the n-type GaAs substrate 120 to the back electrode 110. This is often referred to as a current crowding problem.

One technique to solve the current crowding problem is disclosed by Fletcher et al in a U.S. Pat. No. 5,008,718. The proposed LED structure is shown in FIG. 2 (in this figure, layers that are not changed in view of the structure of FIG. 1 are labelled with the same reference numerals), in which a window layer 200 is grown upon the p-type AlGaInP layer 133. The window layer 200 should be selected from materials that have a low electrical resistivity so that current could be spread out laterally, and a bandgap higher than that of the AlGaInP layers so that the window layer is transparent to light emitted from the active layer of AlGaInP.

In an LED for generating light in the spectrum from red to orange, a AlGaAs material is selected to form the window layer 200. The AlGaAs material has an advantage that it has a lattice constant in match with that of the underlying GaAs substrate 120. While in an LED for generating light in the spectrum from yellow to green, a GaAsP or a GaP material is used to form the window layer 200. It is drawback of using the GaAsP or the GaP material that their lattice constants are not in match with that of the AlGaInP layers 130 and the GaAs substrate 120. The lattice mismatch causes a high dislocation density so that optical performance is still not satisfactory.

FIG. 3 shows a third prior art LED disclosed in Photonics Spectra, December 1991, pp. 64-66, by H. Kaplan. The LED of FIG. 3, in addition to the structure of FIG. 1, is fabricated with a reflector layer 310, a current-blocking layer 300, a current spreading layer 330. The current spreading layer 330 has a very low electrical electricity and the current blocking layer 300 is arranged at a position where it is in alignment with the front electrode 140. The current injected from the front electrode 140 thus is spread out laterally by the current blocking layer 300. Moreover, the reflector layer 310 can be used to prevent the light emitted by the active layers from being absorbed by the GaAs substrate.

It is a drawback of the LED of FIG. 3 that the fabricating process, in which the MOVPE procedure needs to be performed twice, is complex. Moreover, the p-type AlGaInP layer 133 is easily oxidized since it contains a large proportion of aluminum.

SUMMARY OF THE INVENTION

In accordance with the object of the present invention, there is provided a light emitting diode, which comprises a second conductivity type ZnSSe window layer, an active layer sandwiched by a first confining layer and a second confining layer. The substrate underlying the first confining layer is of a first conductivity type GaAs, i.e. p-type.

The second type ZnSSe window layer has a low electrical resistivity, a bandgap higher than that of the active layer, and a better lattice match with its underlying second confining layer. The second type ZnSSe window layer can therefore be used as a current spreading layer and is transparent to light emitted from the active layers.

BRIEF DESCRIPTION OF THE DRAWINGS

The present invention can be more fully understood by reading the subsequent detailed description of the preferred embodiments thereof with references made to the accompanying drawings, wherein.

DETAILED DESCRIPTION OF THE PREFERRED EMBODIMENTS

Figure 1:
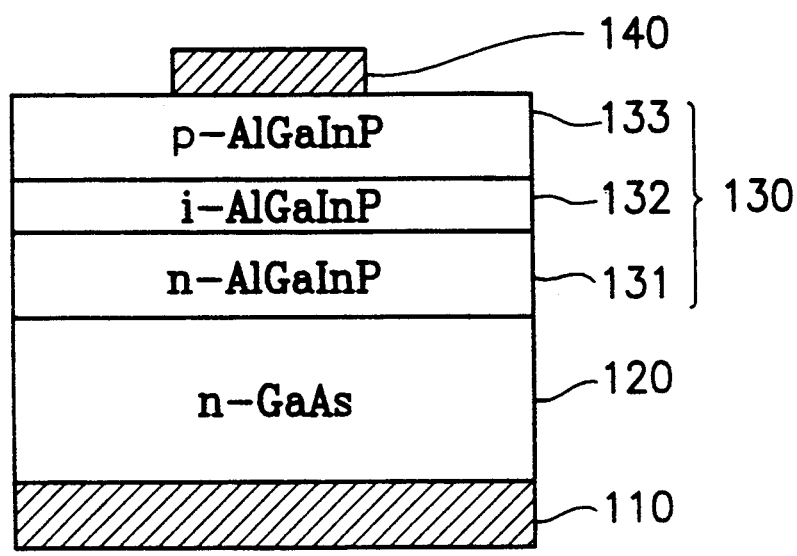
FIG. 1 is a sectional illustration of a first prior art LED.
Figure 2:
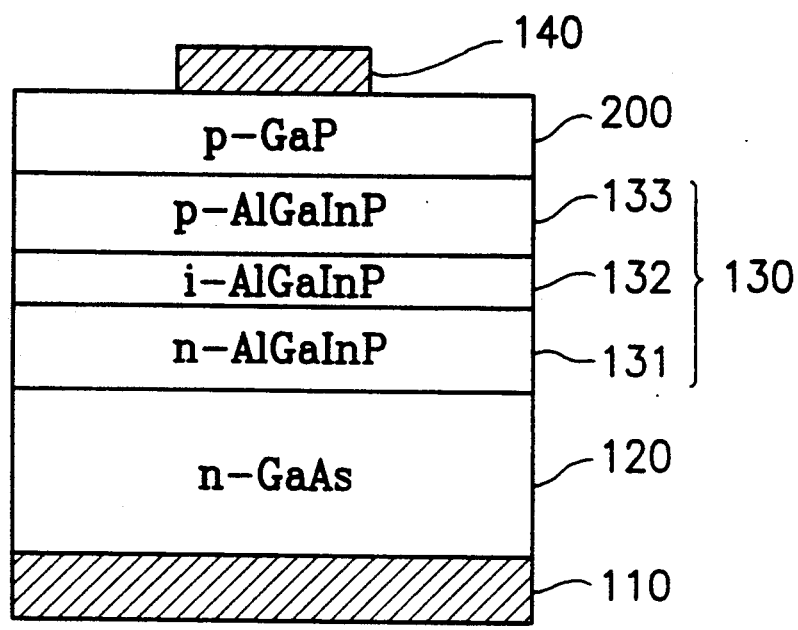
FIG. 2 is a sectional illustration of a second prior art LED.
Figure 3:
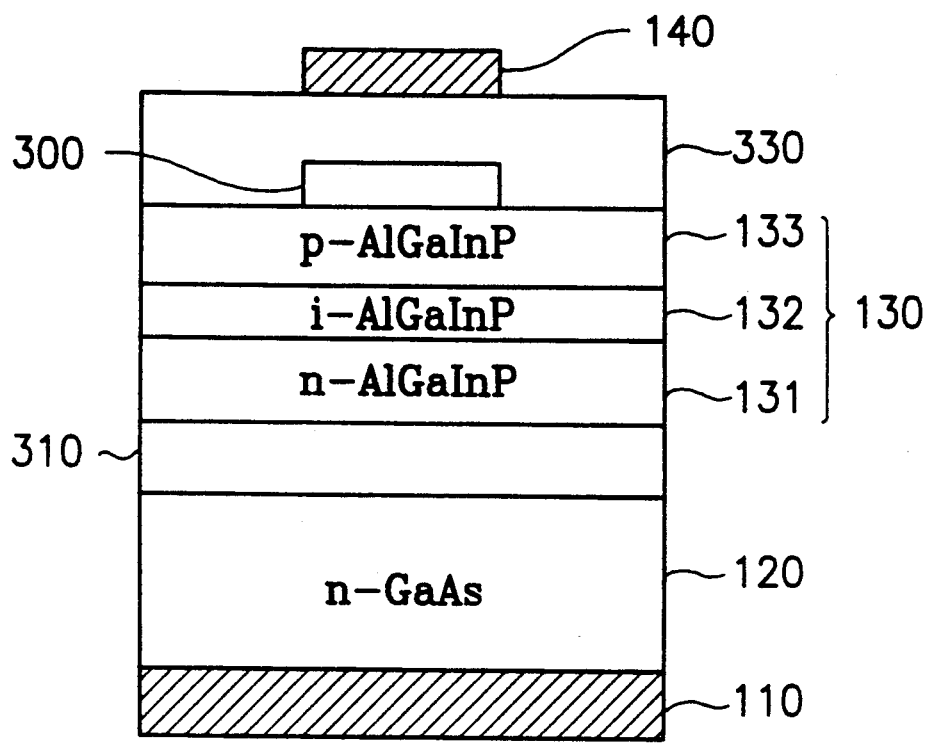
FIG. 3 is a sectional illustration of a third prior art LED.
Figure 4:
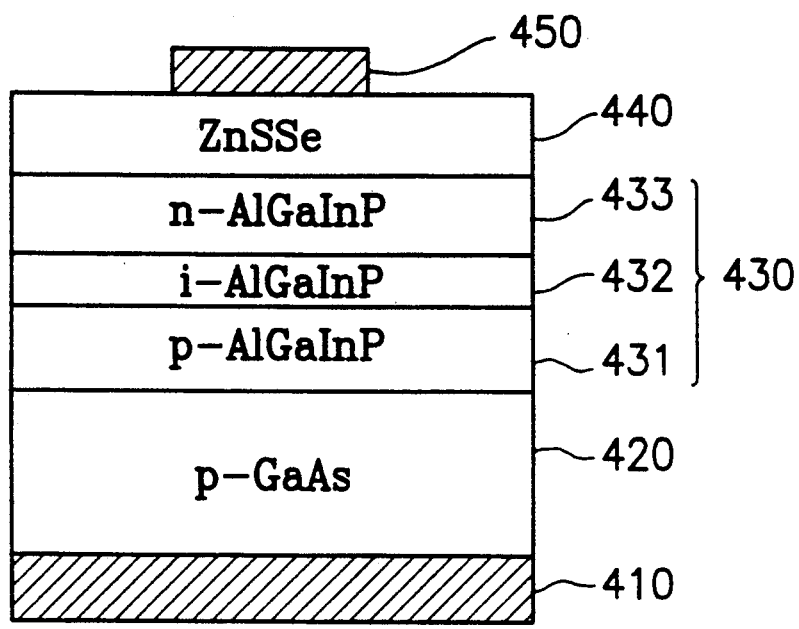
FIG. 4 is a sectional illustration of an LED fabricated in accordance with the present invention.

FIG. 4 is a sectional view illustrating the structure of an exemplary LED constructed in accordance with the present invention. The LED of FIG. 4 includes a back electrode 410, a substrate of p-type GaAs 420, a double heterostructure of AlGaInP 430, a layer of ZnSSe 440, and a front electrode 450. The double heterostructure of AlGaInP 430 includes, as in the LEDs of FIGS. 1-3, a layer of p-type AlGannP 431, a layer of undoped AlGaInP 432, and a layer of n-type AlGaInP 433. However, since p-type GaAs is used herein as the substrate, the confining layers, i.e. the p-type AlGaInP 431 and the n-type AlGaInP 433 are interchanged as compared with the LEDs of FIGS. 1-3.

The semiconductor material ZnSSe can be doped with a donor concentration of more than $10^{-18}$ cm$^{-3}$ and the free electrons contributed by the dopants are with high mobility. Accordingly, the doped ZnSSe layer 440 has a low order magnitude of electrical resistivity, so that it has a current-spreading capability.

It is another material characteristic of ZnSSe that its bandgap is higher than that of the AlGaInP. Therefore, the ZnSSe layer 440 is transparent to light emitted by the active AlGaInP layer 432. Therefore, the ZnSSe layer 440 acts also as a window layer to the LED of FIG. 4.

Furthermore, the lattice constant of the ZnSSe semiconductor is very close to that of the AlGaInP semiconductor. Therefore, the dislocation density resulted from a lattice mismatch in the junction between the ZnSSe layer 440 and the n-type AlGaInP layer 433 is lower than that in the junction between the GaP layer 200 and the p-type AlGaInP 133 of the prior art LED of FIG. 2. This is true even if sulfur is absent, i.e. using a layer of ZnSe.

The ZnSSe transparent layer can be expressed with the formula $Zn.S_x.Se_{1-x}$, with the sulfur composition (x) of the $Zn.S_x.Se_{1-x}$ transparent layer being within the range from 0.0 to 0.12 to allow the LED to exhibit good optical characteristic. However, it is particularly found that the dislocation density caused by lattice mismatch is at the minimum value when the proportion of sulfur contained in the ZnSSe layer 440 is within a range of about from $x=0.05$ to $x=0.06$. Within this composition range, the LED is found to exhibit the optimal optical characteristic.

The AlGaInP alloy as utilized by the LED of FIG. 4 can be expressed with the formula $(Al_xGa_{1-x})_{0.51}In_{0.49}P$. Changing the proportion of aluminum in each AlGaInP layer will cause a change in the color of emitted light. For example, if $x=0$ is for the active layer of AlGaInP 432 and $x=0.3$ is for the confining layer of AlGaInP 431, 433, then the emitted light will have a red color. If the aluminum proportion is increased so that $x=0.7$ is for the active layer of AlGaInP 432 and $x=1$ is for the confining layer of AlGaIn 431, 433, then the emitted light will have a green color.

The present invention has been described hitherto with exemplary preferred embodiments. However, it is to be understood that the scope of the present invention need not be limited to the disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A light emitting diode comprising:
   a) a p-type substrate;
   b) a p-type first confining layer formed in junction with said substrate;
   c) an active layer formed in junction with said first confining layer;
   d) an n-type second confining layer formed in junction with said active layer; and
   e) a single layer of ZnSSe semiconductor material of an n-type formed in junction with said second confining layer whereby a window layer with current spreading capabilities is formed.

2. A light emitting diode as recited in claim 1, wherein said single layer of ZnSSe semiconductor material is doped with a donor concentration of greater than $10^{-18}$ cm$^{-3}$ with high mobility free electrons whereby the electrical resistivity of said transparent window layer of ZnSSe is reduced and the current-spreading capability is increased.

3. A light emitting diode as recited in claim 1, wherein said p-type first confining layer, said n-type second confining layer, and said active layer comprise a semiconductor material having a formula of $(Al_xGa_{1-x})_{0.51}In_{0.49}P$.

4. A light emitting diode as recited in claim 3, wherein the aluminum composition (x) of said $(Al_xGa_{1-x})_{0.51}In_{0.49}P$ semiconductor material in said p-type first confining layer and said n-type second confining layer is in the range from 0.3 to 1.0.

5. A light emitting diode as recited in claim 3, wherein the aluminum composition (x) of said $(Al_xGa_{1-x})_{0.51}In_{0.49}P$ semiconductor material in said active layer is in the range from 0.0 to 0.7.

6. A light emitting diode as recited in claim 1, wherein said single layer of ZnSSe semiconductor material of an n-type has a formula $Zn\,S_x\,Se_{1-x}$, and the sulfur composition (x) thereof is in the range from 0.0 to 0.12.

* * * * *